United States Patent [19]

Kuzuya

[11] Patent Number: 5,210,581
[45] Date of Patent: May 11, 1993

[54] IMAGE RECORDING APPARATUS HAVING IMAGE SURFACE LAMINATING CAPABILITY

[75] Inventor: Susumu Kuzuya, Gihu, Japan

[73] Assignee: Brother Kogyo Kabushiki Kaisha, Tokyo, Japan

[21] Appl. No.: 592,817

[22] Filed: Oct. 4, 1990

[30] Foreign Application Priority Data

Oct. 4, 1989 [JP] Japan ............................ 1-259328

[51] Int. Cl.$^5$ ............................................ G03G 15/20
[52] U.S. Cl. ............................ 355/290; 355/282; 355/285; 355/289; 355/295; 355/27; 156/277; 430/138
[58] Field of Search ............... 355/282, 285, 289, 290, 355/292–295, 202, 277–280, 27, 204, 208; 430/98, 99, 124, 138; 156/353, 269, 277; 118/45, 46; 346/108, 25, 76, 76 PN

[56] References Cited

U.S. PATENT DOCUMENTS

| H931 | 6/1991 | Feldman et al. ............... 430/138 |
| H1,019 | 2/1992 | Feldman et al. ............... 430/138 |
| 3,607,519 | 9/1971 | Beyer et al. ................. 156/277 X |
| 3,788,930 | 1/1974 | Honjo et al. ................. 430/124 X |
| 3,799,827 | 3/1974 | Takimoto et al. ............ 430/124 X |
| 3,813,267 | 5/1974 | Honjo et al. ................. 430/99 X |
| 4,287,285 | 9/1981 | Mosehauer .................. 156/277 X |
| 4,504,837 | 3/1985 | Toyoda et al. ............... 156/277 X |
| 4,560,426 | 12/1985 | Moraw et al. ................ 156/277 X |
| 4,624,560 | 11/1986 | Beery ............................ 355/27 |
| 4,780,742 | 10/1988 | Takahashi et al. ........... 430/124 X |
| 5,017,452 | 5/1991 | Feldman ....................... 430/138 |
| 5,030,540 | 7/1991 | Sangyoji et al. ............. 430/138 |

FOREIGN PATENT DOCUMENTS

| 0016415 | 6/1978 | Japan ............................ 156/277 |
| 2188168 | 9/1987 | United Kingdom . |
| 2198857 | 6/1988 | United Kingdom . |
| 2202641 | 9/1988 | United Kingdom . |
| 2203255 | 10/1988 | United Kingdom . |
| 2204142 | 11/1988 | United Kingdom . |

Primary Examiner—R. L. Moses
Assistant Examiner—Matthew S. Smith
Attorney, Agent, or Firm—Oliff & Berridge

[57] ABSTRACT

An image recording apparatus for recording an image on an image receiving member in cooperation with a photosensitive pressure-sensitive member. The apparatus includes an exposure unit for exposing the photosensitive pressure-sensitive member to an imaging light to form a latent image thereon, a pressure developing unit for pressure developing the latent image and forming a visible image on the image receiving member, and a thermal fixing unit for thermally fixing the visible image formed thereon. To prevent the image-formed surface of the image receiving member from being smeared or damaged, a lamination unit is provided for laminating a film on at least one surface of the image receiving member.

13 Claims, 3 Drawing Sheets

IMAGE RECORDING APPARATUS HAVING IMAGE SURFACE LAMINATING CAPABILITY

BACKGROUND OF THE INVENTION

The present invention relates to an image recording apparatus, and more particularly to an image recording apparatus wherein a film lamination can be performed on an image surface of an image recording sheet.

There has been known an image recording apparatus of the type wherein a photosensitive member and an image receiving member are used to reproduce the image of an original document. The photosensitive member has a surface coated with an immense number of photosensitive and pressure rupturable microcapsules encapsulating a chromogenic material therein. The image receiving member has a surface coated with a developer material which reacts with the chromogenic material.

In such type of the image recording apparatus, the photosensitive member is image exposed to form a latent image corresponding to an image of the original document, and is then introduced into a pressure developing unit together with the image receiving member. In the pressure developing unit, a pressure is applied to the photosensitive member and the image receiving member held in superposed relation, so that the chromogenic material released from the ruptured microcapsules reacts with the developer material and a visible image is formed on the image receiving member. The image receiving member is thereafter fed into a thermal fixing unit to thermally fix the image formed thereon.

In such an image recording apparatus, there is a problem such that the image-formed surface of the image receiving member tends to be smeared with finger prints, alcohol, water or the like. Further, after the image formation, if a number of the image receiving members are left in stacked condition, the image-formed surface of one developer sheet adheres to the reverse side of another, thereby damaging the image.

SUMMARY OF THE INVENTION

The present invention has been made to solve the above-noted problems, and accordingly it is an object of the invention to provide an image recording apparatus wherein the image-formed surface of an image receiving member is prevented from being smeared or damaged.

In order to achieve the above and other objects, there is provided an image recording apparatus for recording an image on an image receiving member in cooperation with a photosensitive pressure-sensitive member, the image receiving member having first and second surfaces, comprising exposure means for exposing the photosensitive pressure-sensitive member to an imaging light to form a latent image thereon, pressure developing means for pressure developing the latent image and forming a visible image on the first surface of the image receiving member, thermal fixing means for thermally fixing the visible image formed on the first surface of the image receiving member, and lamination means for laminating a film member on at least one of the first and second surfaces of the image receiving member.

In the image recording apparatus of the present invention thus arranged, the exposed photosensitive member is superposed on the image receiving member and both are applied with a pressure in the pressure developing means to thereby form the visible image on the image receiving member. Then, after thermally fixing the image on the image receiving member, at least one surface of the image receiving member is film-laminated by the lamination means. Accordingly, the film-laminated surface of the image receiving member is prevented from being smeared or damaged.

The above and other objects, features and advantages of the present invention will become more apparent from the following description when taken in conjunction with the accompanying drawings in which preferred embodiments of the present invention is shown by way illustrative examples.

DETAILED DESCRIPTION OF THE PREFERRED EMBODIMENTS

Preferred embodiments of the present invention will now be described hereinbelow with reference to the accompanying drawings.

In the embodiments of the invention, a transfer type image recording medium as disclosed in U.S. Pat. No. 4,399,209 to Sanders et al is used as a photosensitive member. Briefly, this recording medium has a surface coated with an immense number of microcapsules encapsulating a photocuring (or photo-softening) resin and a chromogenic material of one of three primary colors, i.e., cyan, magenta and yellow. An image receiving member to be used in cooperation with the microcapsule sheet has a surface coated with a developer material. When the microcapsule sheet is selectively exposed to an imaging light, the mechanical strength of the microcapsules in the exposed area changes from soft to hard or vice versa to thereby form a latent image thereon corresponding to the pattern of the exposure. The latent image on the microcapsule sheet is developed under pressure, wherein the microcapsules of weaker mechanical strength are ruptured and the chromogenic material released therefrom reacts with the developer material, thereby forming a visible image on the developer sheet.

Figure 1:
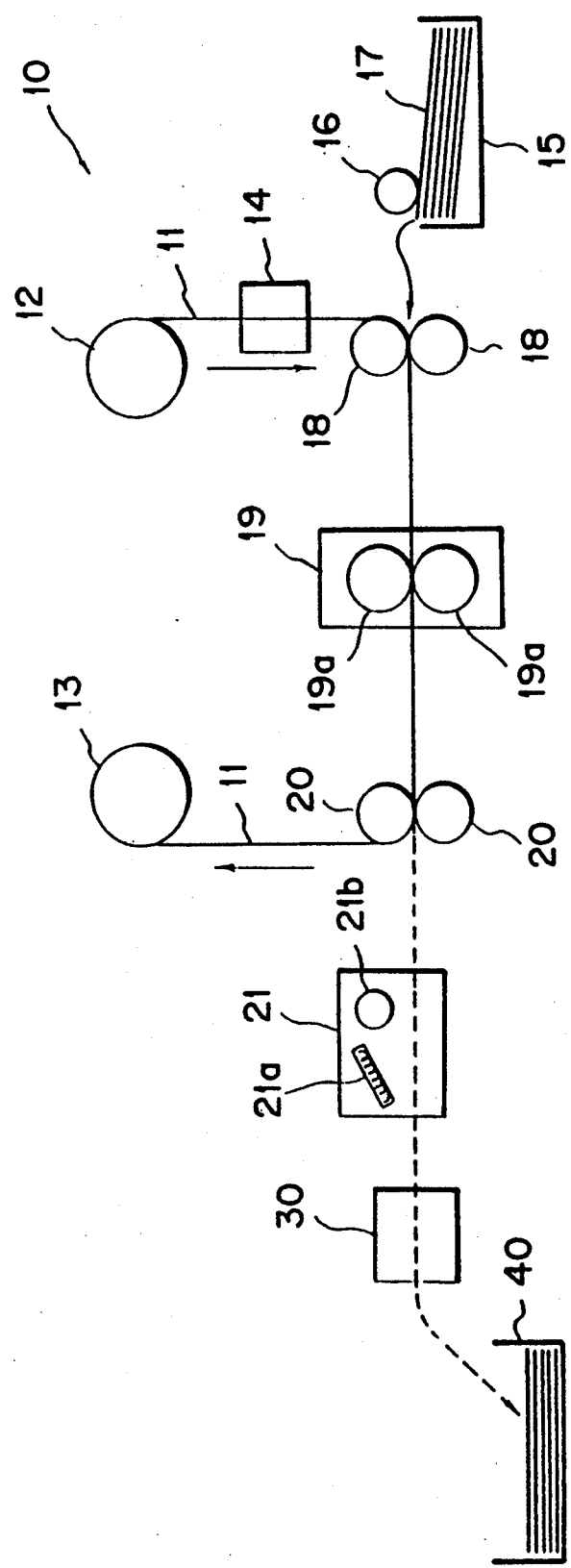
FIG. 1 is a schematic diagram showing an image recording apparatus according to the present invention.

FIG. 1 is a schematic view showing an image recording apparatus according to the present invention. The image recording apparatus 10 includes a supply roller 12 and a take-up roller 13, wherein an elongated, web-like photosensitive member 11 rolled around the supply roller 12 is unrolled and is conveyed along a path indicated by an arrow and is wound up on the take-up roller 13.

An exposure unit 14 is disposed downstream of the supply roller 12 with respect to the direction in which the photosensitive member 11 is conveyed, wherein the photosensitive member 11 is exposed to an imaging light to form a latent image thereon.

In downstream of the exposure unit 14, a pair of registration rollers 18, 18 are disposed for bringing an image receiving member 17 into facial contact with the photosensitive member 11 upon aligning the image receiving member 17 with respect to the photosensitive member 11. The image receiving member 17 is in the form of a cut sheet having leading and trailing edges. A stack of the image receiving members are stored in a sheet cassette 15 and the uppermost image receiving member 17 is fed out one by one by a feedout roller 16 disposed above the sheet cassette 15.

A pressure developing unit 19 is disposed further downstream of the registration rollers 18, 18. The unit 19 includes a pair of pressurizing rollers 19a, 19a therein, wherein the photosensitive member 11 and the image receiving member 17 are applied with pressure to develop the latent image formed on the photosensitive member 11.

In downstream of the pressure developing unit 19, there is disposed a pair of separation rollers 20, 20 for separating the image receiving member 17 from the photosensitive member 11. The photosensitive member 11 is then wound around the take-up roller 13. On the other hand, the image receiving member 17 is conveyed along a path indicated by a dotted line in FIG. 1 after being separated from the photosensitive member 11 by the separation rollers 20, 20.

In the conveying path of the image receiving member 17, a thermal fixing unit 21 is disposed for thermally fixing the image on the image receiving member 17. The thermal fixing unit 21 includes a heat applying means 21a, such as a heater, and a blower means 21b, such as a fan. Heated air is blown onto the image-formed surface of the image receiving member 17 by the heat applying means 21 and the blower means 21b, whereby the image formed on the image receiving member 17 is thermally fixed.

Figure 2A:
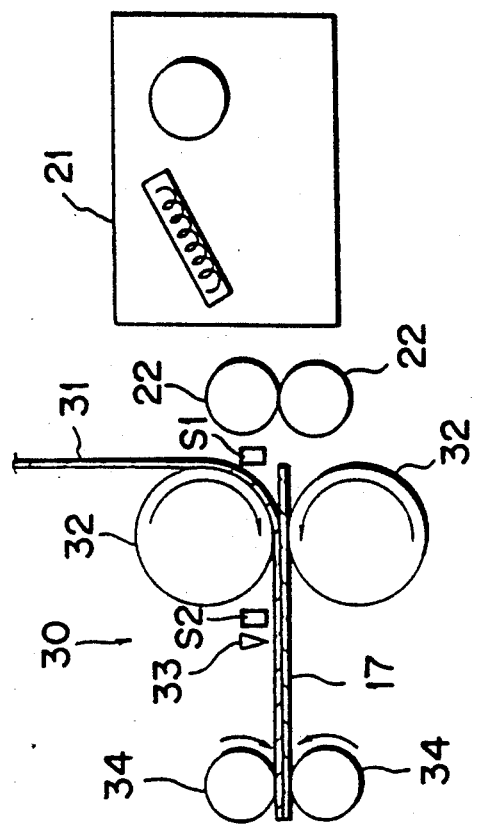
FIGS. 2A and 2B are schematic diagrams showing film laminations by a lamination unit according to one embodiment of the present invention.
Figure 2B:
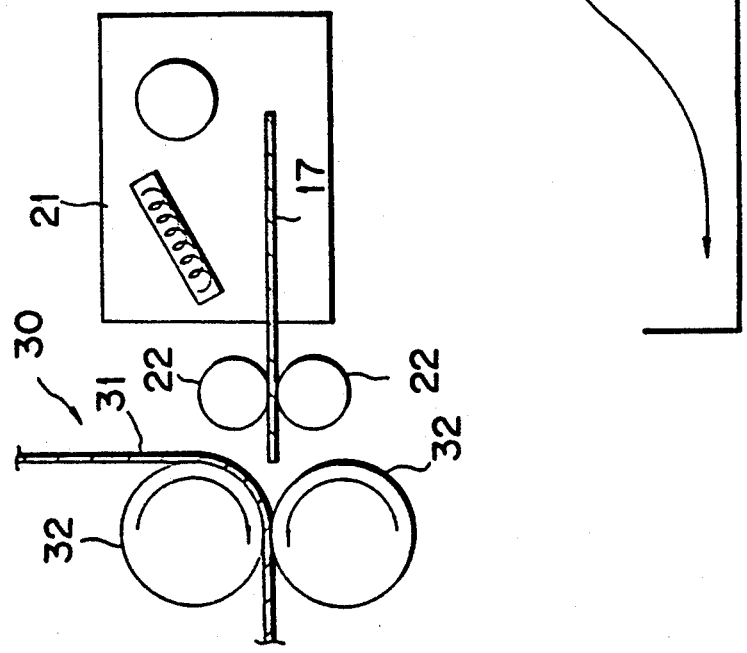

Adjacent the thermal fixing unit 21 and in the immediate downstream side thereof, a lamination unit 30 is disposed for laminating a film 31 on the image-formed surface of the image receiving member 17. As shown in FIGS. 2A and 2B, the lamination unit 30 includes a first sensor S1 for sensing the leading edge of the image receiving member 17 and outputting a first signal when the leading edge thereof is sensed, a first pair of rollers 32, 32 having a nip therebetween allowing to pass the film 31 and the image receiving member 17 therethrough when the rollers 32, 32 are being rotated, the rollers 32, 32 being rotated in response to the first signal outputted from the first sensor S1, a second sensor S2 for sensing the trailing edge of the image receiving member 17 and outputting a second signal when the trailing edge thereof is sensed, a cutter 33 for cutting the film 31 at the trailing edge of the image receiving member 17 in response to the second signal outputted from the second sensor S2, and a second pair of roller 34, 34 for discharging the film-laminated image receiving member 17 onto a discharge tray 40.

Figure 3:
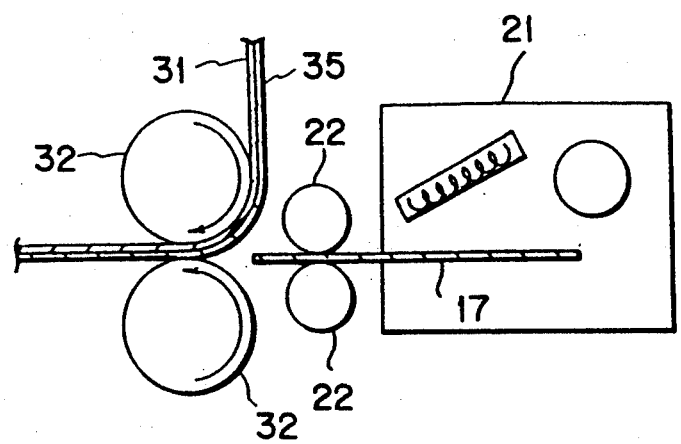
FIG. 3 is a schematic diagram showing a film lamination by a lamination unit according to another embodiment of the present invention.

The film 31 is, for example, made of a PET (polyethylene terephthalate) having a thickness of about 0.05 mm. Further, as shown in FIG. 3, a PET film 31 to which a transparent double sided adhesive tape 35 is adhered may be used. Due to the adhesive tape 35, the PET film 31 is firmly laminated on the image-formed surface of the image receiving member 17.

Operation of the lamination unit 30 will now be described.

As shown in FIG. 2A, when the image receiving member 17 is introduced into the lamination unit 30 by the aid of guide rollers 22, 22, the leading edge of the image receiving member 17 is sensed by the first sensor S1. In response to the output from the sensor S1, the first pair of the rollers 32, 32 start rotating in the direction indicated by arrows. Then, the image receiving member 17 and the film 31 are brought into facial contact with each other and are applied with pressure, thereby laminating the film 31 on the image receiving member 17. Since the lamination unit 30 is disposed adjacent the pressure developing unit 21, the film 31 can be laminated on the image receiving member 17 under the condition where the image receiving member 17 still stores heat received from the heat applying means 21a, with the result that the film lamination can be accomplished completely.

The film laminated image receiving member 17 is conveyed by the second pair of rollers 34, 34 as shown in FIG. 2B. When the trailing edge of the image receiving member 17 is sensed by the second sensor S2, the cutter 32 is actuated in response to the output from the sensor S2 to cut the film 31 at a position when the trailing edge of the image receiving member 17 is brought to the position confronting the cutter 33. Thereafter, the film laminated image receiving member 17 is discharged by the rollers 34, 34 onto the tray 40.

Figure 4:
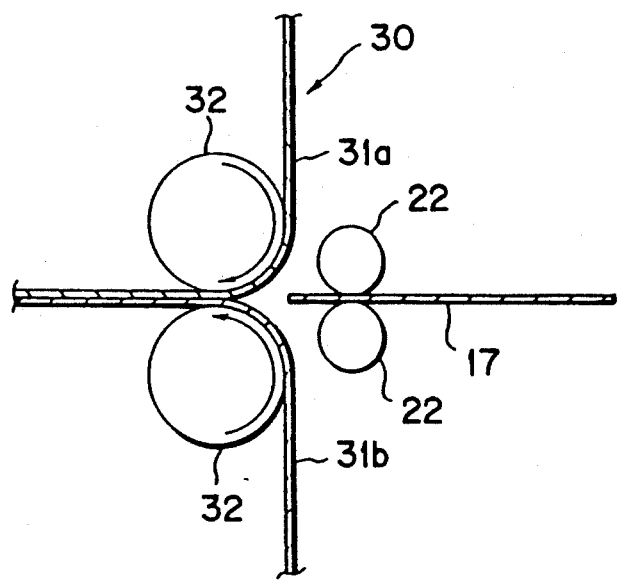
FIG. 4 is a schematic diagram showing a film lamination by a lamination unit according to still another embodiment of the present invention.

FIG. 4 shows another embodiment of the lamination unit 30. In this embodiment, both the image-formed surface and its reverse surface of the image receiving member 17 are laminated by the films 31a and 31b. The aforementioned PET film or the PET film with the adhesion of the transparent double sided adhesive tape are usable for lamination.

Figure 5:
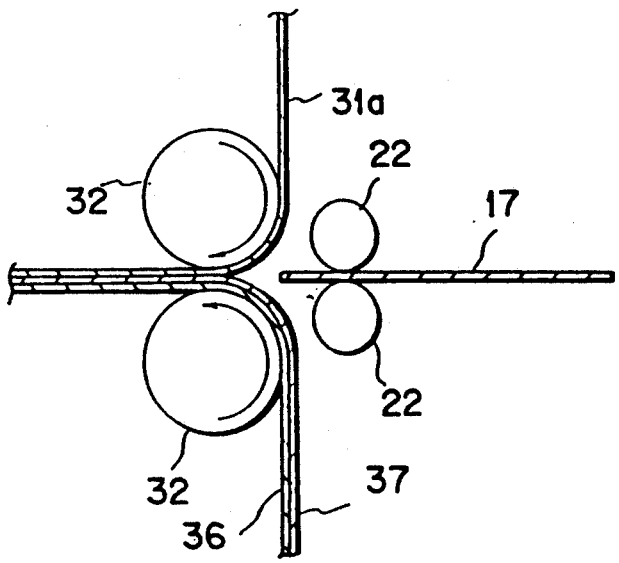
FIG. 5 is a schematic diagram showing a film lamination by a lamination unit according to yet another embodiment of the present invention.

As shown in FIG. 5, a double sided adhesive tape 37 having a surface to which a paper is peelably attached may be laminated on the reverse side of image receiving member 17. The thus laminated image receiving member 17 can be attached to a desired portion by peeling off the paper.

As described, the image-formed surface of the image receiving member 17 can be laminated with a film, so that the image on the image receiving member 17 can be prevented from being damaged.

What is claimed is:

1. An image recording apparatus for recording an image on an image receiving member in cooperation with a photosensitive pressure-sensitive member, the image receiving member having first and second surfaces, comprising:

exposure means for exposing the photosensitive pressure-sensitive member to an imaging light to form a latent image thereon;

pressure developing means for pressure developing the latent image and forming a visible image on the first surface of the image receiving member;

thermal fixing means for thermally fixing the visible image formed on the first surface of the image receiving member, wherein the image receiving member is heated to an elevated temperature; and lamination means for laminating a film member on at least one of the first and second surfaces of the image receiving member, wherein said image receiving member at substantially said elevated temperature alone provides heat to the lamination means.

2. An image recording apparatus according to claim 1, wherein the image receiving member is conveyed in a predetermined direction, and wherein said lamination means is disposed immediate downstream of said thermal fixing means with respect to the direction in which the image receiving member is conveyed.

3. An image recording apparatus according to claim 2, wherein the image receiving member is in a cut sheet form having a leading edge and a trailing edge, and wherein said lamination means comprises a first sensing means for sensing the leading edge of the image receiving member and outputting a first signal when the leading edge thereof is sensed; a pair of rollers having a nip therebetween allowing the film and the image receiving members to pass therethrough when said pair of rollers are being rotated, said pair of rollers being rotated in response to the first signal outputted from said first sensing means; a second sensing means for sensing the trailing edge of the image receiving member and outputting a second signal when the trailing edge thereof is sensed; and cutting means responsive to the second signal outputted from said second sensing means for cutting the film member at a position when the trailing edge of the image receiving member is brought in confrontation with said cutting means.

4. An image recording apparatus according to claim 3, wherein the film member comprises polyethylene terephthalate having a thickness of about 0.05 mm.

5. An image recording apparatus according to claim 3, wherein the film member comprises a transparent base member, and a transparent double sided adhesive member with one surface thereof being adhered to one surface of said transparent base member.

6. An image recording apparatus according to claim 5, wherein the transparent base member comprises polyethylene terephthalate having a thickness of about 0.05 mm.

7. An image recording apparatus according to claim 3, wherein the film member comprises a transparent base member, a transparent double sided adhesive member with one surface thereof being adhered to one surface of said transparent base member, and a peelable member peelably attached to another surface of said transparent double sided adhesive member, the film member being used to laminate the second surface of the image receiving member.

8. An image recording apparatus for recording an image on an image receiving member in cooperation with a photosensitive pressure-sensitive member, the image receiving member having first and second surfaces, comprising:

exposure means for exposing the photosensitive pressure-sensitive member to an imaging light to form a latent image thereon;

pressure developing means for pressure developing the latent image and forming a visible image on the first surface of the image receiving member;

thermal fixing means for thermally fixing the visible image formed on the first surface of the image receiving member, wherein the image receiving member is heated to an elevated temperature; and lamination means for laminating a film member on at least one of the first and second surfaces of the image receiving member, wherein the image receiving member is conveyed in a predetermined direction, and said lamination means is disposed immediately downstream of said thermal fixing means with respect to the direction in which the image receiving member is conveyed, and wherein said image receiving member at substantially said elevated temperature supplies sufficient heat to the lamination means to laminate the film member to the image receiving member.

9. An image recording apparatus according to claim 8, wherein the image receiving member is in a cut sheet form having a leading edge and a trailing edge, and wherein said lamination means comprises a first sensing means for sensing the leading edge of the image receiving member and outputting a first signal when the leading edge thereof is sensed; a pair of rollers having a nip therebetween allowing the film and the image receiving member to pass therethrough when said pair of rollers are being rotated, said pair of rollers being rotated in response to the first signal outputted from said first sensing means; a second sensing means for sensing the trailing edge of the image receiving member and outputting a second signal when the trailing edge thereof is sensed; and cutting means responsive to the second signal outputted from said second sensing means for cutting the film member at a position when the trailing edge of the image receiving member is brought in confrontation with said cutting means.

10. An image recording apparatus according to claim 9, wherein the film member comprises polyethylene terephthalate having a thickness of about 0.05 mm.

11. An image recording apparatus according to claim 9, wherein the film member comprises a transparent base member, and a transparent double sided adhesive member with one surface thereof being adhered to one surface of said transparent base member.

12. An image recording apparatus according to claim 11, wherein the transparent base member comprises polyethylene terephthalate having a thickness of about 0.05 mm.

13. An image recording apparatus according to claim 9, wherein the film member comprises a transparent base member, a transparent double sided adhesive member with one surface thereof being adhered to one surface of said transparent base member, and a peelable member peelably attached to another surface of said transparent double sided adhesive member, the film member being used to laminate the second surface of the image receiving member.

* * * * *